United States Patent [19]

Bowers et al.

[11] Patent Number: 5,802,084
[45] Date of Patent: Sep. 1, 1998

[54] GENERATION OF HIGH POWER OPTICAL PULSES USING FLARED MODE-LOCKED SEMICONDUCTOR LASERS AND OPTICAL AMPLIFIERS

[75] Inventors: John E. Bowers, Santa Barbara; Alan Mar, Arcadia, both of Calif.; Roger J. Helkey, Webster, Mass.; Judy Karin, Goleta, Calif.

[73] Assignee: The Regents of the University of California, Oakland, Calif.

[21] Appl. No.: 337,985

[22] Filed: Nov. 14, 1994

[51] Int. Cl.$^6$ .................................................. H01S 3/098
[52] U.S. Cl. ........................................................... 372/18
[58] Field of Search ................................. 372/50, 18, 49, 372/108, 99; 359/340, 344, 346

[56] References Cited

U.S. PATENT DOCUMENTS

| | | |
|---|---|---|
| 4,251,780 | 2/1981 | Scifres et al. . |
| 4,349,905 | 9/1982 | Ackley .................................. 372/46 |
| 4,744,089 | 5/1988 | Montroll et al. ......................... 372/50 |
| 5,134,621 | 7/1992 | Marshall ................................. 372/25 |
| 5,392,308 | 2/1995 | Welch et al. ............................ 372/50 |

OTHER PUBLICATIONS

Derickson et al., "Short Pulse Generation Using Multisegment Mode-locked Semiconductor Lasers," IEEE Joe, vol. 28,#10, Oct. 1992.

Derickson et al., "Short Pulse Generation Using Multisegment Mode-Locked Semiconductor Lasers," IEEE Journal of Quantum Electronics, vol. 28, No. 10, Oct. 1992, pp. 2186–2202.

H.A. Haus, "Modelocking of Semiconductor Laser Diodes," Japanese Journal of Applied Physics, vol. 20, No. 6, Jun. 1981, pp. 1007–1020.

J.R. Karin et al., "Ultrafast Dynamics in Field–Enhanced Sturable Asorbers," Applied Physics Letters, vol. 64, No. 6, 7 Feb. 1994, pp. 676–678.

J.R. Karin et al., "Carrier Heating Dynamics in Semiconductor Waveguide Saturable absorbers," APL Nov. 21, 1994.

Alan Mar et al., "Mode–Locked Multisegment Resonant–Optical Waveguide Diode Laser Arrays," IEEE Photonics Technology Letters, vol. 5, No. 12, Dec. 1993, pp. 1355–1359.

Peter J. Delfyett et al., "High–Power Ultrafast Laser Diodes," IEEE Journel of Quantum Electronics, vol. 28, No. 10, Oct. 1992, 2203–2219.

J.N. Walpole et al., "High–Power Strained–layer InGaAs/AlGaAs Tapered Traveling wave amplifier, Applied Phys. Letter, vol. 61, No. 7, 17 Aug. 1992 pp. 740–742.

Ross Parke et al., "2.0 W CW, Diffraction–Limited Operation of a Monolithically Integrated Master Oscillator Power Amplifier," IEEE Photonics Technology Letters, vol. 5, No. 3, Mar. 1993 pp. 297–300.

*Primary Examiner*—Rodney B. Bovernick
*Assistant Examiner*—Robert E. Wise
*Attorney, Agent, or Firm*—Daniel L. Dawes

[57] ABSTRACT

The mode-locked laser with improved pulse power output can be realized by combining an optical oscillator with a flared CW or modulated gain amplifier. An optical filter or isolator may be disposed between the oscillator and amplifier to avoid feedback of spontaneous noise. A two-segment laser is devised by providing a flared gain section between a modulated gain section and an absorber section within the integrated semiconductor laser. The flared section may taper from a larger modulated gain section to a smaller cross section absorber section or vice versa. Various combinations of absorber sections coupled to modulated gain sections by CW gain or passive flared gain sections may be combined with various arrangements of reflectors and tapered CW gain amplifiers are cascades of such amplifiers and modulated gain pairs.

A saturable absorber may be used in a two-segment laser in which the absorber is bleachable and has a characteristic temperature which is increased during short time periods so that a passive gain is realized by the return pulse traveling through the saturable absorber provided that the returning pulse is timed to coincide with the temporal gain realized in the absorber.

10 Claims, 8 Drawing Sheets

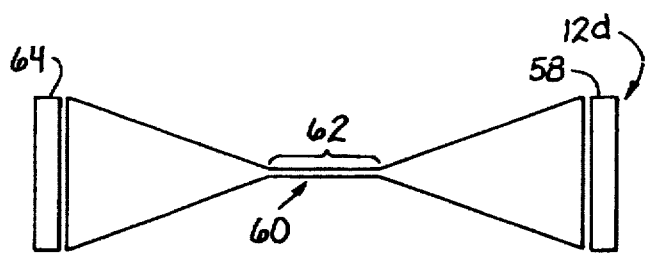
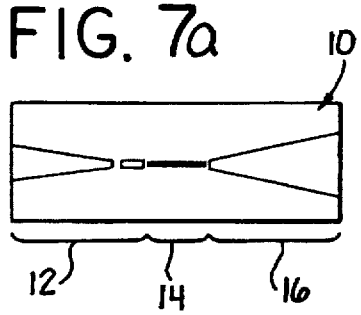
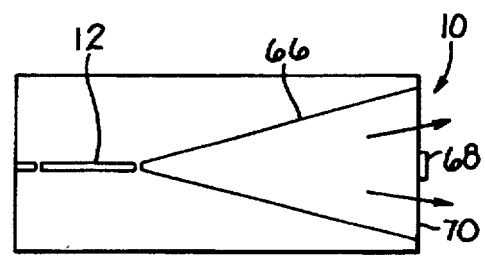
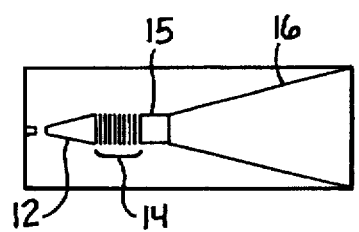
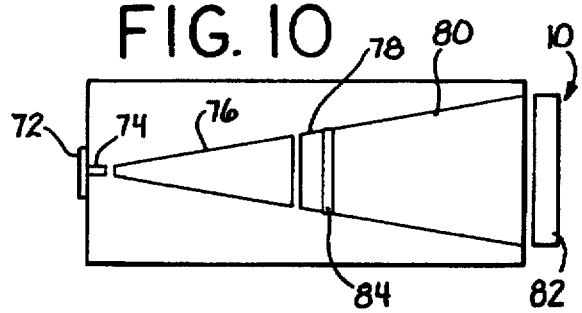
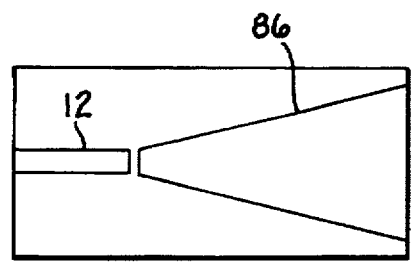
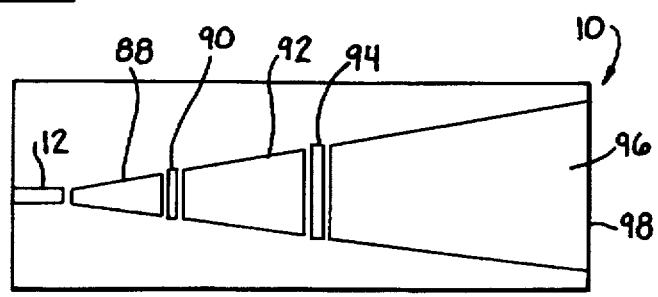

GENERATION OF HIGH POWER OPTICAL PULSES USING FLARED MODE-LOCKED SEMICONDUCTOR LASERS AND OPTICAL AMPLIFIERS

Part of this invention was made with Government support under Grant No. N00014-90-J-1162 awarded by the Office of Naval Research. The Government has certain rights thereto.

BACKGROUND OF THE INVENTION

1. Field of the Invention

The invention relates to the field semiconductor lasers, and in particular to pulsed mode-locked diode lasers.

2. Description of the Prior Art

Mode-locked semiconductor diode lasers have been recognized as small, reliable and inexpensive sources of sub-picosecond optical pulses with moderate peak powers over wide wavelength ranges. Mode-locked semiconductor diode lasers are used in telecommunications systems, high speed analog-to-digital converters, electro-optical sampling systems, optical computing, phased-array radar systems, optical microwave frequency sources and in many situations requiring multiple wavelength high speed optical pulses. The electrically pumped semiconductor lasers are compact, are available over a wide range of wavelengths using band gap engineering, and are integratable with other optical electronic devices.

However mode-locked semiconductor lasers heretofore have not approached the performance of large bench top laser systems, such as dye lasers and solid-state lasers, in terms of output power. Conventional mode-locked semiconductor lasers operate with an average power output of the order of several milliwatts. This output power has been improved somewhat by means of post amplification and compression to achieve high peak powers. See P. J. Delfyette et al., "High Power Ultrafast Laser Diodes," Journal of Quantum Electronics, 28, 10, 2220–2229, Oct. 1992. For example, tapered master oscillator power amplifiers (MOPA) have been demonstrated to be capable of multiple watt continuous wave power using diode injection. See D. Mehuys et al., "2.0 W CW Diffraction-Limited Tapered Amplifier with Diode Injection," Electronics Letters, 28, 21, 1944–45 Oct. 1992. The gain in such amplifiers is maximized by minimizing the parasitic gain depletion caused by amplified spontaneous emission (ASE) noise, especially at the input end of the amplifier. Flared waveguides have previously been used as amplifiers for continuous wavelasing sources. See J. Walpole et al., "High-Power Strained-Layer Indium Gallium Arsenide/Aluminum Gallium Arsenide Traveling Wave Amplifier," Applied Physics Letters, 61, 740–942 (1992).

Therefore, what is needed is some type of design for a semiconductor mode-locked laser which is capable of providing an improved output power comparative to that achieved by dye lasers and other solid state lasers.

BRIEF SUMMARY OF THE INVENTION

The invention is a pulsed laser assembly comprising a mode-locked semiconductor laser, and a tapered semiconductor optical amplifier having an input optically coupled to an output of the mode-locked semiconductor laser. As a result of this combination, increased power output is realized.

The tapered optical amplifier is in one embodiment a semiconductor amplifier integrated with the mode-locked laser.

The laser assembly may further comprise an optical filter or isolator disposed between the mode-locked laser and the tapered optical amplifier to reduce the spontaneous emissions from the amplifier being passed through to the mode-locked laser.

In one embodiment the mode-locked laser is a two-segment laser with a gain section and an absorber section. The gain section is flared. In one embodiment the flared gain section is flared away from the absorber section. In another embodiment the flared gain section is flared toward the absorber section.

The invention is also characterized as a laser comprising a modulated gain region, an absorber region, and a CW gain flared region disposed between the modulated gain region and absorber region. The modulated region and absorber region have differently sized cross sections and the CW flared region transitions between the different cross sections of the modulated region and absorber region. As a result, a mode-locked laser with increased pulse power output is realized.

In one embodiment the modulated region has larger cross section than the absorber region. The CW flared region tapers down toward the absorber region. In another embodiment the modulated region has a cross section less than the absorber region and the CW flared region tapers up to the larger cross section of the absorber region. In yet another embodiment the CW flared region is flared both toward the modulated gain region and the absorber region and has a minimum cross section between the modulated gain region and absorber region and has matching cross sections adjacent to the modulated gain region and absorber region.

The invention is still further defined as a laser assembly comprising a mode-locked laser including a flared gain region having an output facet and a reflector providing partial reflection disposed on the output facet. The partial reflector comprises a reflector in a narrow portion of the flared gain region.

The invention is also defined as a laser comprising a first reflector, a saturable absorber region coupled to the first reflector and having an output, a tapered gain region having an input coupled to the output of the saturable absorber region, a modulated gain region having an input coupled to an output of the tapered gain region, a flared CW gain region having an input coupled to a output of the modulated gain region, and a second reflector disposed on an output of the CW flared gain region so that the mode-locked laser is provided with higher pulsed output.

The tapered gain region may be a CW gain region or a passive gain region, and the flared region may be modulated synchronously with the mode-locked laser or modulated gain region as appropriate. The second reflector could be disposed not on the output of the CW flared gain region, but instead disposed on the output of the modulated gain region.

The tapered optical amplifier may be a CW gain amplifier and further comprise at least one additional cascaded amplifier stage coupled to an output of the tapered optical amplifier. The stage is comprised of a modulated gain section having an output coupled to a CW gain flared section. A plurality of the stages can be serially cascaded together.

The invention is yet further characterized as a laser comprising a saturable absorber to provide passive mode-locking saturable absorption. A fast recovering gain element shapes the optical pulses in the laser without electronics and phase locking by means of time-dependent saturable gain within the saturable absorber. The saturable absorber and fast recovering gain elements may be used in a semiconductor laser such as an in-plane laser or a vertical cavity laser, a solid-state laser, a gas laser, a dye laser or a fiber laser. The saturable absorber is characterized by having an absorption which can be bleached and characteristic temperature which can be increased.

The invention can also be defined as an improvement in a laser comprising a reflecting element for reflecting light pulses from one end of the laser. A saturable absorber is provided in the laser having temporally dependent saturable gain. In the illustrated embodiment the gain is passive, but actively induced temporal variations are included with the scope of the claims. The absorber is spaced apart from the reflecting element by a predetermined distance to shape optical pulses in the laser and phase lock the optical pulses in the laser by means of the time-dependent passive saturable gain. The predetermined distance is such that a light pulse reflected from the reflecting element reaches the saturable absorber at a time when the passive saturable gain is reduced.

The improvement further comprises an element, such as an electrode disposed in contact with the saturable absorber, for applying a voltage to the saturable absorber to raise carrier temperature therein to increase the time dependence of the saturable gain.

Thus it must be understood as well that the invention can be defined as an improvement in a method of operating a laser comprising generating a light pulse in a laser and transmitting the light pulse through a saturable absorber. The return of the light pulse to the saturable absorber is delayed by a predetermined time period. The saturable absorber has a temporally dependent saturable gain following a first transit of the light pulse therethrough. The predetermined time period is such that the light pulse returns to the saturable absorber at a time when the saturable gain is reduced.

The improvement in the method further comprises applying a voltage to the saturable absorber to raise carrier temperature therein to increase the time dependence of the saturable gain.

Delaying the return of the light pulse to the saturable absorber by a predetermined time period is achieved in the illustrated embodiment by reflecting the light pulse back to the saturable absorber from a predetermined distance away from the saturable absorber as determined by the speed of light in the laser to time the return of the light pulse to the saturable absorber when the saturable gain is reduced. However, any means now known or later devised by which such a delay can be achieved is regarded a substantially equivalent.

The invention may be better visualized by viewing the following drawings wherein like elements are referenced by like numerals.

BRIEF DESCRIPTION OF THE DRAWINGS

FIGS. 7a and b are schematics of semiconductor integrated versions of the assembly of FIG. 1.

FIG. 8 is an embodiment of a laser where the waveguide section is flared both toward the absorber and toward the gain section.

FIG. 9 is a schematic of a laser assembly where partial lasing is produced in the flared amplifier.

FIG. 10 is a schematic of a laser assembly where a cascaded flared amplifier is combined with a flared gain section laser.

FIG. 11 is a schematic of a laser assembly where the flared amplifier is synchronously modulated with the mode-locked laser.

FIG. 12 is a schematic of a laser assembly where a plurality of flared amplifier and modulated gain sections are combined.

Figure 1:
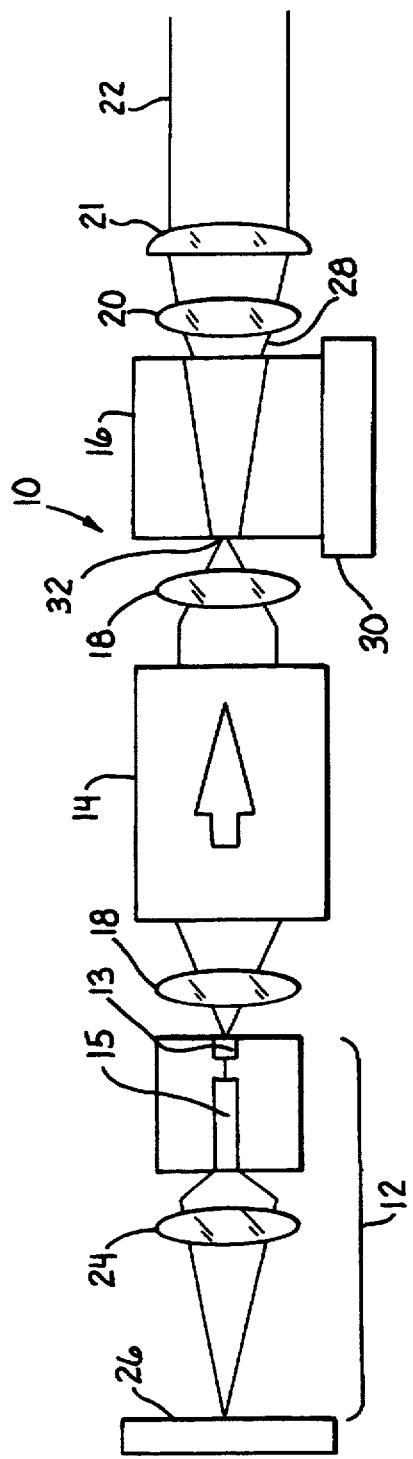
FIG. 1 is a schematic diagram of a laser assembly in which a mode-locked laser and flared amplifier are combined.

The invention and its various embodiments may now be better understood by turning to the following detailed description.

DETAILED DESCRIPTION OF THE PREFERRED EMBODIMENTS

The mode-locked laser with improved pulse power output can be realized by combining an optical oscillator with a flared CW or modulated gain amplifier. An optical filter or isolator may be disposed between the oscillator and amplifier to avoid feedback of spontaneous noise. A two-segment laser is devised by providing a flared gain section between a modulated gain section and an absorber section within the integrated semiconductor laser. The flared section may taper from a larger modulated gain section to a smaller cross section absorber section or vice versa. Various combinations of absorber sections coupled to modulated gain sections by CW gain or passive flared gain sections may be combined with various arrangements of reflectors and tapered CW gain amplifiers are cascades of such amplifiers and modulated gain pairs.

A saturable absorber may be used in a two-segment laser in which the absorber is bleachable and has a characteristic temperature which is increased during short time periods so that a passive gain is realized by the return pulse traveling through the saturable absorber provided that the returning pulse is timed to coincide with the temporal gain realized in the absorber.

Before turning to the invention, consider some general principles relating to laser mode-locking. Laser mode-locking is a technique of generating distinct optical pulses by modulation of a resonant cavity. That is to say, the gain or loss (negative gain) of a resonant laser cavity may be modulated, such as by a sinusoidal driving signal, to thereby provide a maximum gain to the optical signal at the peak of the amplitude modulation with the loss of the optical signal increasing away from the amplitude modulation peak. This causes optical pulses to be created within the cavity. Each time a pulse travels through the cavity, the pulse tails receive less gain than the pulse peak, thereby leading to a pulse width shortening. The optical pulse width decreases until the pulse shortening per pass within the resonant cavity is balanced by the pulse broadening per pass due to other physical mechanisms. Stable modelocking is the result.

The optical spectrum of a mode-locked laser is typically a series of modes corresponding to the Fabry-Perot cavity modes of the laser. When the optical modes add up in phase, short optical pulses are generated. The term mode-locking is a frequency domain description in which optical cavity modes are coupled in phase to produce a short pulse. However, under continuous wave conditions, the maximum spectral gain occurs at one mode, so that the laser tends to operate on a main mode for a homogenously broadened laser or a few modes for an inhomogenously broadened laser. In addition, to coupling the modes in phase, the mode-locking mechanism must also couple energy from each mode to the adjacent modes.

Active mode-locking is a technique in which the modulation is externally applied to the resonant cavity. Semiconductor lasers are well suited for active mode-locking, since electrical contact to the semiconductor laser for high frequency gain modulation is easily implemented. Frequency modulation mode-locking has also been demonstrated in semiconductor lasers. For FM mode-locking, during every round-trip of the cavity, the frequency modulation shifts the optical frequency up or down depending on the position in the modulation waveform. Optical pulses are formed because the self-consistent solution only allows optical energy at the stationary points in the modulation waveform.

Passive mode-locking uses a saturable absorber in order to operate under the same gain modulation principle, but the gain modulation is supplied by the optical pulse itself. The absorber attenuates the beginning of the optical pulse which leads to overall pulse shortening. After the absorber saturates, the center of pulse experiences a net gain. As the pulse continues to propagate, saturation of the gain medium reduces the gain to below threshold and shuts off lasing. Semiconductor lasers are also usable with passive mode-locking with an integral saturable absorber.

There are many ways to devise a semiconductor laser using a saturable absorber. One method is ion implantation to introduce recombination centers on one facet of the laser, which decreases the carrier recombination time and forms a saturable absorber. Another approach is to split the gain contact and to reverse bias one segment to form an integrated waveguide saturable absorber.

The power output and pulse energy from a mode-locked laser with an intra-waveguide saturable absorber is limited by the saturation energy of the saturable absorber as given by:

$$E_{sat} = h\nu A/(\Gamma dg/dn) \quad (1)$$

Where A is the active region cross section, hv the photon energy, $\Gamma$ the confinement factor, and dg/dn the differential gain which is a parameter of the material being used and is the instantaneous ratio of the change in gain, g, as a function of the change of carrier density, n.

At large pulse energies compared to $E_{sat}$, ineffective net pulse shaping on each round-trip in the laser cavity occurs. As described below, the use of a post amplification stage provides the advantage of allowing the mode-locked master oscillator to be independently optimized at lower pulse energies for the power amplification stage. In addition, tapered single pass amplifiers have the advantage of increased pulse energies because the saturation energy can be made relatively large at the flared output end of the amplifier, because of the dependence on A in equation (1) above. By expanding the gain cross section along the length of the amplifier, as the amplified power grows, a more uniform power density and degree of gain saturation is maintained throughout the amplifier. The spectral and temporal distortion effects of the gain saturation are also less deleterious in a single-pass post amplification stage, as opposed to the effect in the mode-locked oscillator, where pulse evolution occurs over many round-trips within the device.

First consider the idealized schematic of FIG. 1 wherein a mode-locked tapered-stripe master oscillator power amplifier is depicted. The laser assembly of FIG. 1 is collectively denoted by reference numeral 10. An external cavity, two section, passively mode-locked laser, collectively denoted by reference numeral 12 has its output coupled to an optical isolator 14. Optical isolator 14 has its output in turn coupled to a tapered-stripe semiconductor amplifier 16. Coupling optics, symbolically denoted by coupling lenses 18 are used for coupling between laser 12 and optical isolator 14, and between optical isolator 14 and semiconductor amplifier 16. The output of semiconductor amplifier 16 may then be coupled through output collimation lenses 20 and 21 to provide an output beam 22.

In the diagrammatically illustrated embodiment of FIG. 1, laser 12 includes a coupling lens 24 focused on a mirror 26 to form part of the passively mode-locked laser 12. In the illustrated embodiment, laser 12 emits light at about 930 nanometers, although other frequencies could be chosen according to the design option. In the embodiment of FIG. 1, the overall length of laser 12 is about 650 microns with an absorber section 13 with a length of 70 microns and the remaining balance of the length included within gain section 15 of laser 12. External cavity two-section passively mode-locked lasers are known in the art and have been described by D. J. Derickson, "*Short Pulse Generation Using Multi Segment Mode-Locked Lasers,*" Journal of Quantum Electronics 28, 10, 2186–2202, Oct. 1992. Passive mode-locking is initiated in laser 12 by biasing shorter section 13 of the two-section laser below transparency to form a center of saturable absorption.

The use of a six centimeter length external cavity in FIG. 1 results in a mode-locked pulse repetition rate of 2.5 Gigahertz for laser 12. Amplifier 16 has a four-micron wide single mode input waveguide which expands within amplifier 16 to 130 micron width at its output facet 28. Amplifier 16 is mounted with its p-side down on a copper heatsink 30 for continuous wave operation. Both input facet 32 and output facet 28 of amplifier 16 are provided with a conventional antireflection coatings.

In the illustrated embodiment, two antireflection coated lenses 18 are used to image the output of laser 12 onto the input aperture of tapered amplifier 16. Optical isolator 14 is a conventional optical Faraday isolator which is inserted between lenses 18 to prevent back-emitted amplified spontaneous emission noise from amplifier 16 from being injected into laser 12. The output collimation lenses are comprised of first a Grinrod lens 20, manufactured by Nippon Sheet Glass of Japan and then a cylindrical lens 21 to collimate the output of amplifier 16 with an estimated collection efficiency of approximately 70 percent. Cylindrical lens 21 compensates for astigmatism in the amplifier output that results because the amplifier waveguide has weak lateral index guiding, and which allows the optical mode inside amplifier 16 to expand toward the output end. An aperture defined on facet 28 is used to select out the main lobe of the amplifier emission pattern.

Figure 2:
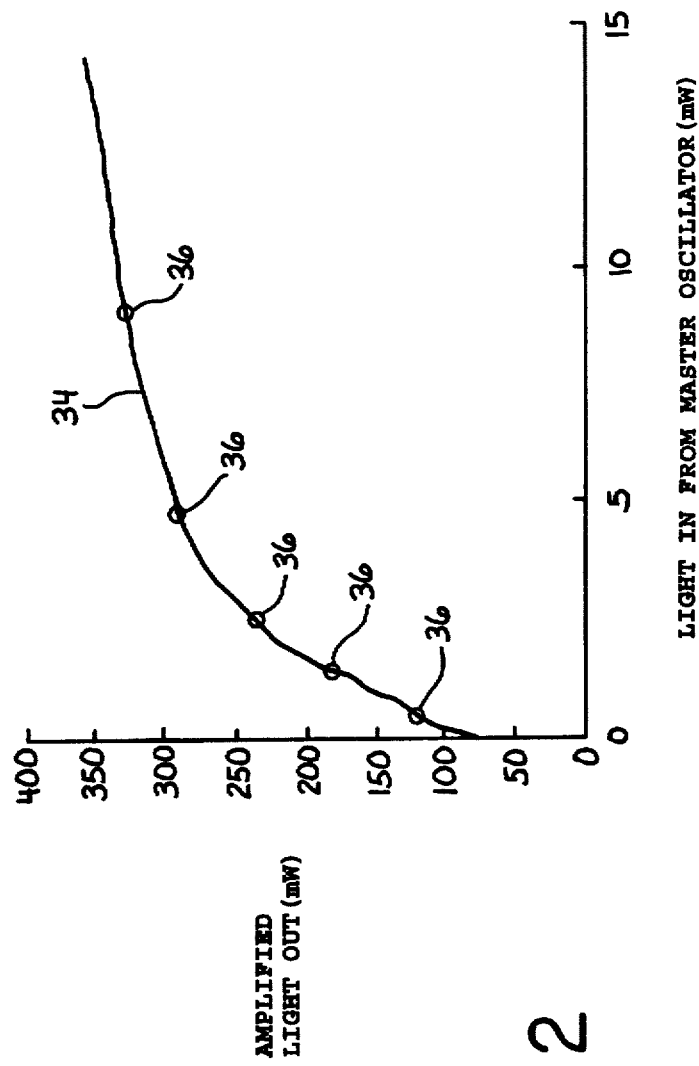
FIG. 2 is a graph of the amplified output power as a function of the master oscillator input power for the assembly of FIG. 1 for both mode-locked and CW operation.

The operation of system 10 in combination with a tapered amplifier as shown in FIG. 1 can be better understood by viewing FIG. 2 which is a graph of the amplified light output from amplifier 16 as a function of the light energy input generated by laser 12 when operated in both continuous wave and mode-locked operation. The solid curve represents continuous wave operation. The light output of FIG. 2 is measured in beam 22 on the output side of collimating lenses 20 and 21 while the output of laser 12 is measured between coupling lenses 18. By operating laser 12 in a continuous wave mode and varying the input current, the amplifier power gain is measured as a function of injected power. Amplifier 16 was biased at a current of 2.0 amps throughout the measurements of FIG. 2.

A clearly saturating output power characteristic above approximately 0.25 watts is exhibited by power gain curve 34 of FIG. 2. The maximum continuous wave power obtained was 353 milliwatts for the illustrated embodiment of FIG. 1 which corresponds to a total output power of over 0.5 watts before losses in the output collimation optics are considered.

Measurements of the average power gain were also taken under mode-locked operation of laser 12 and graphed as open circles in FIG. 2. Such operation caused no discernible effect on the output beam divergence. By inserting a variable attenuator at the input of amplifier 16, measurements at different injection levels were made. These measurements are the circled data points 36 in FIG. 2. The close agreement with the continuous wave measurements indicates that the power extraction efficiency from amplifier 16 is not degraded by the use of mode-locked input pulses.

Figure 3A:
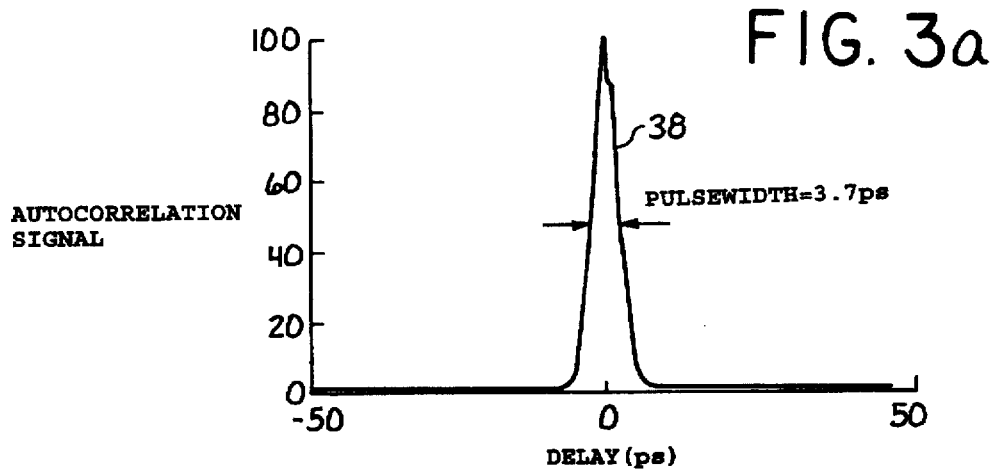
FIGS. 3a and b are autocorrelated graphs of the optical pulse before and after amplification for the assembly of FIG. 1.

Passive mode-locked operation of laser 12 is achieved by terminating short absorbing section 13 of laser 12 into a 30 ohm resistance and forward biasing gain section 15 of laser 12 with a DC current of about 90 milliamps. This results in an average mode-locked output power of 9.1 milliwatts. A second harmonic autocorrelation measurement of these mode-locked pulses as produced by laser 12 before amplification by amplifier 16 is depicted in the graph of FIG. 3a. The second harmonic autocorrelation of the full width half maximum of peak 38 of 5.6 picoseconds, which when assuming a sech$^2$ pulse shape, translates into an actual pulse width of 3.7 picoseconds. Measurements of the optical spectra show that these pulses have bandwidth of about 5.8 nanometers. Therefore, the resulting time-bandwidth product is 7.4 which is 24 times the transform limit, thus, indicating that pulse 38 is highly chirped.

Figure 3B:
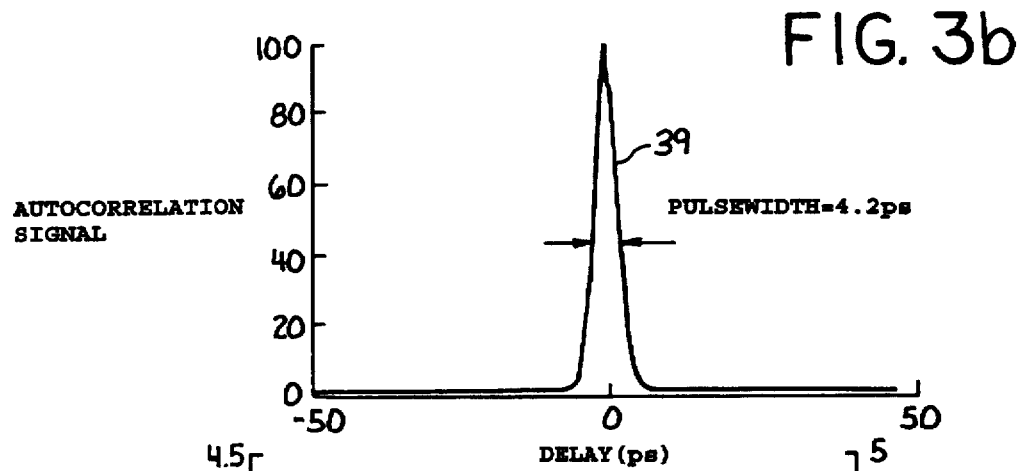

Mode-locking of laser 12 ceases when the back-emitted noise from amplifier 16 was injected into laser 12. The injection noise from amplifier 16 into saturable absorber segment of laser 12 interferes with the recovery of the absorption between pulses. This necessitates the use of isolator 14 between laser 12 and amplifier 16. An important implication of this phenomena is that a monolithically integrated mode-locked laser with an amplifier may require an integrated isolator or saturable absorber as a part of the assembly between the mode locked laser and the amplifier such as shown in FIGS. 1, 7a and 7b. The same autocorrelation output of peak 38 is depicted in FIG. 3b after amplification, illustrating a 28.1 watt peak of the 290 milliwatt average over an autocorrelation full width half maximum 4.2 picoseconds. This represents an average power amplification of well over 300.

Figure 4:
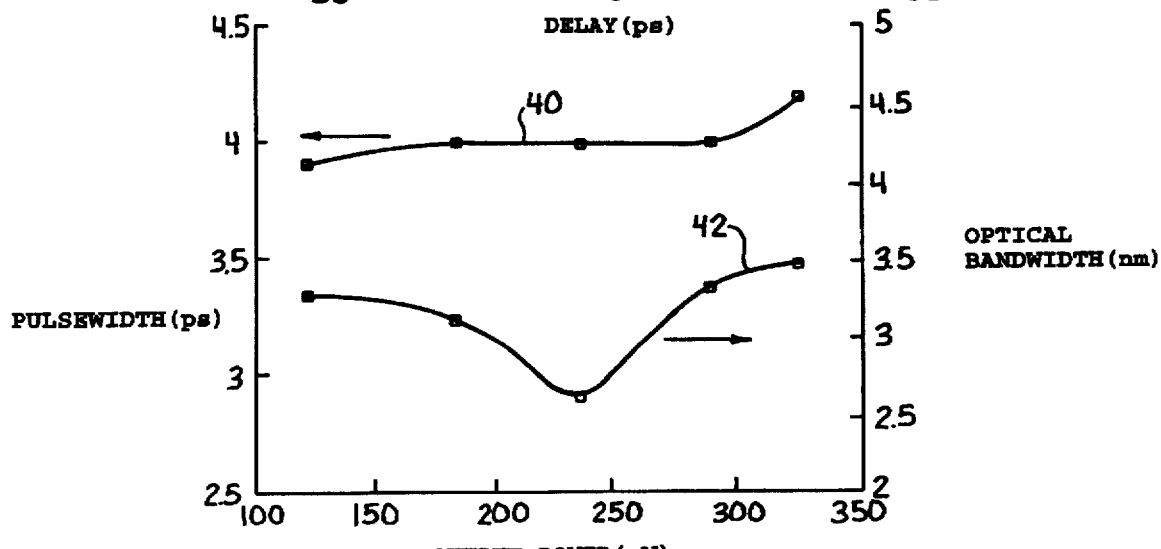
FIG. 4 is a graph of the pulse width and optical bandwidth for the assembly of FIG. 1.

The pulse width characteristics after amplification were measured at various power levels by inserting a variable attenuator at the input of amplifier 16 to obtain the graph of FIG. 4 wherein pulse width is plotting on curve 40 as a function of output power, and optical bandwidth plotted on curve 42 as read from the right-hand vertical scale in FIG. 4 as a function of output power. The tendency toward longer pulses and increased spectral width at higher powers shown in the right-hand of the graph of FIG. 4 is due to the increased effects of self-phase modulation in amplifier 16 at higher pulse energies. At lower energies, the spectral width also increases because of relatively large noise contributions at low power. The amplified spectral width which are obtained are narrower than that of the input due to spectral peaks in the gain, which are also observed in the noise spectra from the amplifier. This is believed to have been caused by an external reflection causing feedback into amplifier 16.

The highest pulse energy obtained was 118 picoJoules corresponding to an internal pulse energy in amplifier 16 of approximately 240 picoJoules. The saturation energy at the output of amplifier 16, where the gain cross section is largest, is approximately 130 picoJoules. Therefore, it is feasible in connection with the system of FIG. 1 to generate pulses with energies higher than the saturation energy from a single pass post amplification amplifier 16. Pulses with energy in excess of the saturation energy cannot be generated in the mode-locked laser itself because of the effects of gain saturation on such high pulse energies after many round trips.

The total average power of amplified output pulse 39 in FIG. 3b was measured at 325 milliwatts, which after subtracting the estimated noise contribution of 29 milliwatts, corresponds to a peak power of about 28.1 watts. Note that although the amplified pulse output comprises 91 percent of the total output power, the modulation depth is 99.9 percent due to the very low duty cycle of the pulsed output.

Therefore, what FIGS. 1–4 demonstrate is that a tapered master oscillator power amplifier system 10 under mode-locked operation can achieve heretofore unobtained average and peak mode-locked output powers without pulse compression. This of course does not exclude from the scope of the invention the addition of a pulse compressor at the output of the tapered amplifier. Although the amplifier saturation energy limits the pulse energy obtainable in system 10, the configuration enables the generation of pulses with energies in excess of the amplifier saturation energy, $E_{sat}$, confirming that such operation is feasible with the use of a post amplification stage. The high power obtained from a mode-locked master oscillator power amplifier assembly makes it a viable compact, efficient semiconductor option for use as a replacement for much larger and more costly mode-locked laser systems.

Having considered the use of tapered amplifiers, consider now the use of flared sections in the laser itself. The tapered waveguide expands the optical mode from a narrower region which give a single lateral optical mode to wider multi-mode region for higher power. The power output and pulse energy from mode-locked laser with an intrawaveguide saturable absorber is limited by the saturation energies of the absorber and gain regions.

Figure 5A:
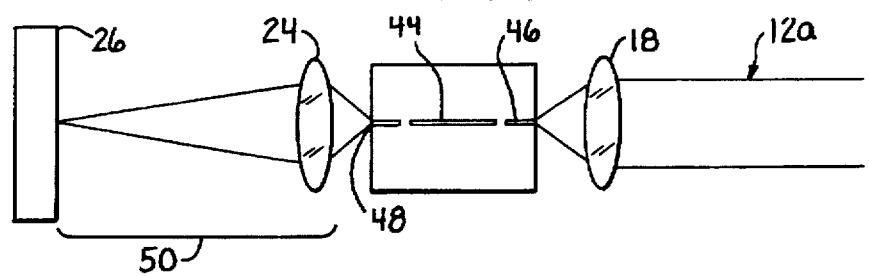
FIGS. 5a–c are diagrammatic depictions of a laser have a uniform, flared absorber and flared gain waveguide section respectively.
Figure 5B:
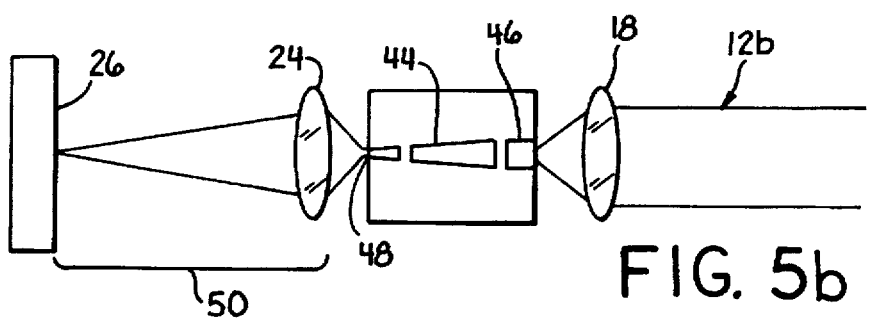
Figure 5C:
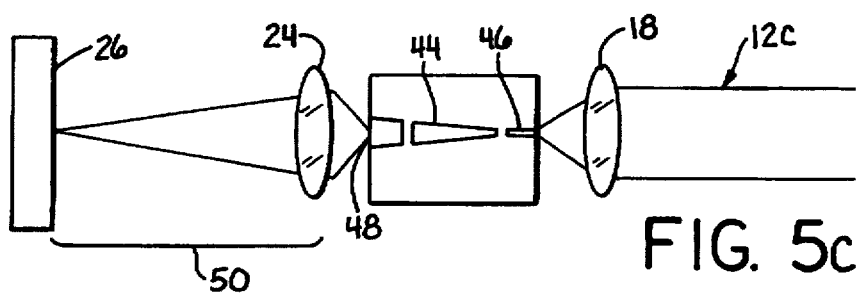

FIG. 5a diagrammatically represents a uniform waveguide mode-locked loser of the type described in connection with the embodiment of FIG. 1. FIGS. 5b and 5c illustrate a flared two-segment waveguide laser in which waveguide 44 between gain section 48 and absorber section 46 is flared. Flared waveguide lasers have the advantage of increased pulse energy because the saturation energy, $E_{sat}$, which is proportional to the mode cross sectional area, can be made relatively large in multi-mode section 44 of laser 12. The mode expansion may occur either toward absorber section 46 as shown in FIG. 5b, or toward gain section 44 as shown in FIG. 5c. Enhanced pulse shortening performance is realized for higher ratios of the gain-to-absorber saturation energies, thereby favoring mode expansion toward the gain segment as shown in FIG. 5c.

Lasers 12b and 12c of FIGS. 5b and 5c, respectively, were two segment lasers coupled to external cavities using a lens in a high reflectivity dielectric mirror 26 with an antireflective coating on facet 49 of laser 12b or 12c coupled to the exterior cavity, generally denoted by reference numeral 50, similar to the embodiment of FIG. 1. Passive mode-locked operation was initiated by reverse biasing the short 70 micron absorber section 46 while biasing gain section 44 above threshold. Diodes of 500 micron cleave lengths were used with an active region of 2.5 microns in the uniform waveguide device of FIG. 5a. The flared gain and flared absorber devices of FIGS. 5b and 5c have linear tapers from about 2.5 microns to 7.5 microns over 150 micron distance. The long taper region was used to allow for adiabatic mode expansion. The beam cross section does not increase as fast as the waveguide width thereby giving an increase in the confinement factor as the waveguide width increases. The lasers of FIGS. 5a–5c were prepared using impurity induced disorder process as described by R. J. Helkey et al., "*Curved and Tapered Waveguide Mode-Locked Indium Gallium Arsenide/Aluminum Gallium Arsenide Semiconductor Lasers Fabricated by Impurity Induced Disordering,*" Device Research Conference, Santa Barbara, Calif., Vol. 1861 (1993). This allows the definition of the nonuniform waveguide shapes as shown in FIGS. 5b and 5c.

Figure 6:
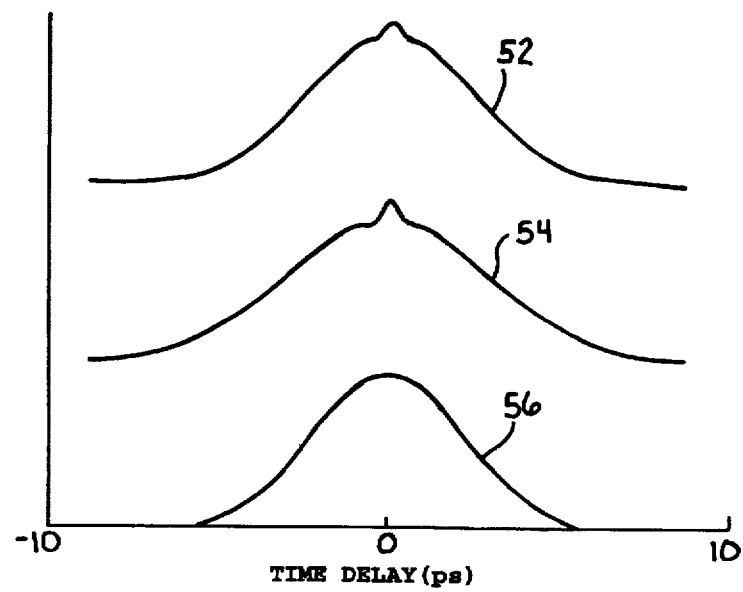
FIG. 6 is a autocorrelation graph of the pulses produced by the devices of FIGS. 5a–c.

Mode-lock operation was initiated by reverse biasing the shorter 70 micron absorber section 46 while biasing gain section 44 above threshold. Diodes of 500 micron cleave lengths were used with an active region width of 2.5 microns for the corresponding uniform waveguide diode of FIG. 5a. The flared gain and flared absorber diodes of FIGS. 5b and 5c had linear tapers over a 150 micron longitudinal distance from 2.5 to 7.5 microns in width. Pulses of 3.5 picoseconds durations and 1.8 picoJoule pulse energy were measured from the output of the uniform waveguide diode 12 of FIG. 5a as illustrated by the autocorrelation signal graphed against time delay shown in FIG. 6. Curve 52 shows autocorrelation pulse shape for uniform waveguide laser 12a of FIG. 5a. Curve 54 corresponds to that of flared absorber laser 12b of FIG. 5b and curve 56 corresponds to flared gain laser 12c of FIG. 5c. Flared absorber laser 12b yielded higher pulse energies of approximately 4.1 picoJoule, but with some degradation of the pulse width, increasing the pulse to 4.2 picoseconds as compared to 3.5 picoseconds for the uniform waveguide laser 12a. The best performance was achieved using flared gain laser 12c which showed a pulse energy of 6.8 picoJoules and a slight improvement in pulse width performance of 3.3 picoseconds. Peak powers of over 2 watts were obtained from flared gain laser 12c which may be the highest peak power yet obtained from a single stripe diode laser.

It is expressly contemplated that larger taper ratios may be used to provide even higher output powers while still using the relatively simple diode laser configuration of FIGS. 5b and 5c.

FIG. 7a and b are diagrammatic depictions of embodiments wherein an integrated semiconductor mode-locked master oscillator power amplifier assembly 10 may be fabricated. Mode-locked laser 12, which may be any one of the forms discussed above in connection with FIGS. 5a–c, is coupled to a flared waveguide amplifier 16 wither a) directly, b) through an optical isolator, or c) through a saturable absorber. The embodiment of FIG. 7b includes an integrated isolator or saturable absorber 15 between Bragg grating reflector 14 and flared waveguide amplifier 16 to isolate amplifier 16 from laser 12.

FIG. 8 represents another diagrammatic depiction of a flared waveguide laser, generally denoted by reference numeral 12d, in which the waveguide is flared both toward the gain and absorber sections. A modulated gain section 58 is coupled through a double tapered mode control section 60 which flares downwardly from modulated gain section 58 to a central neck portion 60 and then again flares outwardly at the same or different rate toward absorber and mode control section 64. The embodiment of FIG. 8 is used for active mode-locking to obtain the characteristics and advantage of both flared absorbers and flared gain sections as depicted separately in FIGS. 5b and 5c.

FIG. 9 is a diagrammatic depiction of a system 10 utilizing a mode-locked laser 12 of any of the types described in the specification in combination with a flared amplifier 66 having at least a partial reflector 68 disposed on its output facet 70. An optical filter, isolator or grating may or may not be disposed between amplifier 66 and laser 12 as design and performance considerations may dictate. Partial reflector 68, which may be partial either in a topographical sense or as a percentage reflection over the entire output aperture of amplifier 68, provides for a partial degree of lasing within amplifier 66.

FIG. 10 is diagrammatic depiction of another embodiment of system 10 in which a reflector 72 is provided for a saturable absorber 74 whose output is then coupled into an actively or passively mode-locked gain section 76. The output of flared gain section 76 has an increasing cross section, the output of which is then coupled to a modulated gain section 78. The output of modulated gain section 78 is then coupled to an additional stage or cascaded with a flared actively mode-locked gain section 80 having a partial reflector 82 disposed on its output aperture.

Alternatively, reflector 82 may be removed and inserted between the modulated gain section 78 and a flared gain section 80 as denoted in doted outline in FIG. 10 and as denoted by reference numeral 84. In this case then, the mode-locked laser is comprised of reflector 72, saturable absorber 74, flared gain section 76, modulated gain section 78 and partial reflector 84. Flared section 80 is then operated as a flared amplifier.

FIG. 11 is a diagrammatic depiction of another embodiment in which a mode-locked laser 12 of any of the embodiments described in the specification is coupled to a flared, modulated gain amplifier 86. Modulated gain amplifier is modulated in synchronization with mode-locked laser 12 to minimize the negative effects normally encountered in flared amplifiers of heating and spontaneous emission causing feedback to the mode-locked laser 12, which effects might otherwise interfere with lasing.

FIG. 12 is a diagrammatic depiction of another embodiment in which a mode-locked laser 12 of any of the types described in the specification has its output coupled to a flared CW gain section 88 whose output in turn is coupled to a modulated gain section 90. A subsequent enlarged CW flared gain section 92 is coupled to the output of modulated gain section 90 and has its output in turn also coupled to a larger modulated gain section 94 having a cross section matching the increased cross section of flared CW gain section 92. Finally, an additional cascaded CW modulated gain section 96 has its input coupled to the output of modulated gain 94 and provides the output facet 98 for the assembly 10 of FIG. 12. The number of cascaded stages and their relative taper ratios can be varied according to design performance objectives.

A key parameter for mode-locked lasers is, sigma, the ratio of gain to absorber saturation energies. Pulse shortening effects are enhanced for higher values of this saturation energy ratio, which is typically about 3 in magnitude in a conventional segmented contact mode-locked laser due to the difference in differential gain between the absorber and gain segments. The saturation energy is proportional to the cross section of optical mode as shown in Equation 1 above. This causes a problem with the flared absorber configuration as shown in FIG. 5b in that the average beam diameter in gain region 48 is smaller than in absorber region 46. As a result, sigma decreases due to the mode-expansion in the absorber flared waveguide 44 of FIG. 5b, which may degrade the mode-locked pulse shaping. The opposite is true in the case of a flared gain laser 12c in FIG. 5c, where the effect of the flared gain segment 48 is exploited to enhance sigma thereby resulting in better mode-locking characteristics.

The value of the saturation energy for a flared amplifier is effectively a weighted value, since the mode area is changing as the pulse propagates. In the case of flared absorber laser of FIG. 5b, if the flare is near absorber 46, nearly the entire amplifier waveguide is single mode, but at the expense of maximum degradation and sigma. If the taper occurs near the amplifier input, the loss in amplifier saturation energy is small, but the lateral mode selectivity is also small. For the case of a flared gain laser shown in FIG. 5c, the opposite is true. Placement of the waveguide flaring near absorber section 46 results in maximum sigma and amplifier saturation energy, but poor lateral mode selectivity. The optimum configuration is to place the flare to maximize amplifier saturation energy and sigma loss while still maintaining single mode operation.

Even higher output energies can be obtained by flaring the amplifying regions even more broadly and mounting the amplifier junction-side down to allow for better heat sinking and operation at a higher biased current. The mode-locked device operates with a gain region biased to strong saturation and is therefore subject to heating.

Figure 13A:
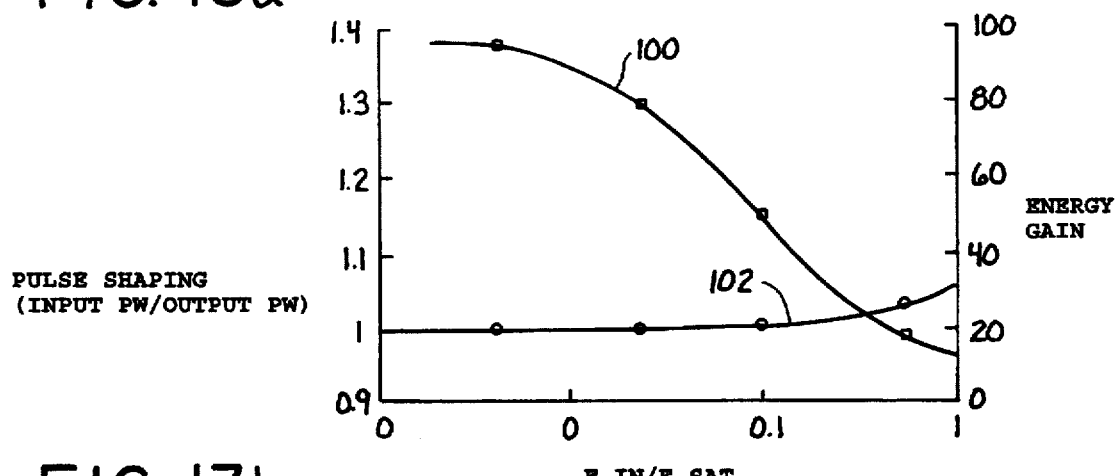
FIGS. 13a and b are graphs of the pulse shaping and energy gain of a flared amplifier as a function of the ratio of input energy and saturation energy for a uniform and flared amplifier respectively.
Figure 13B:
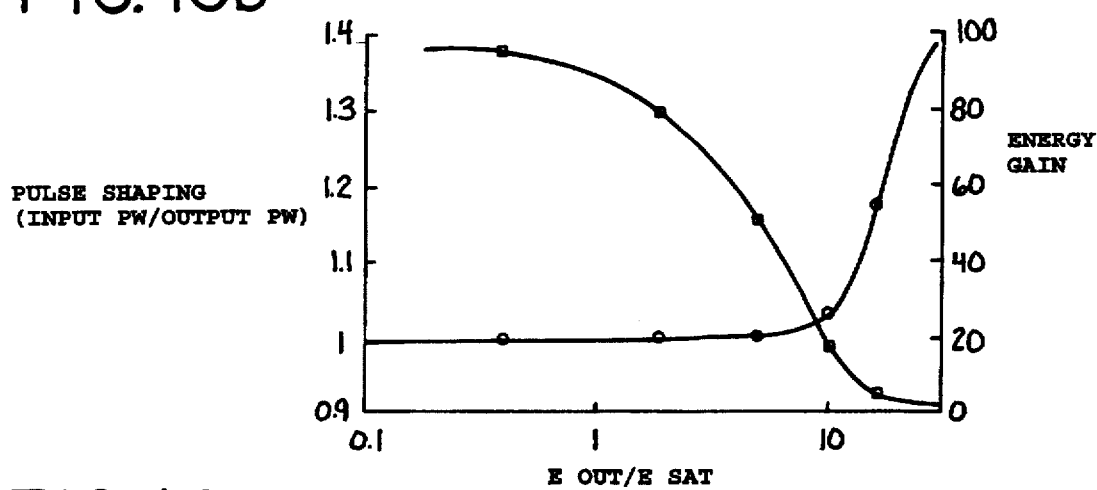
Figure 14A:
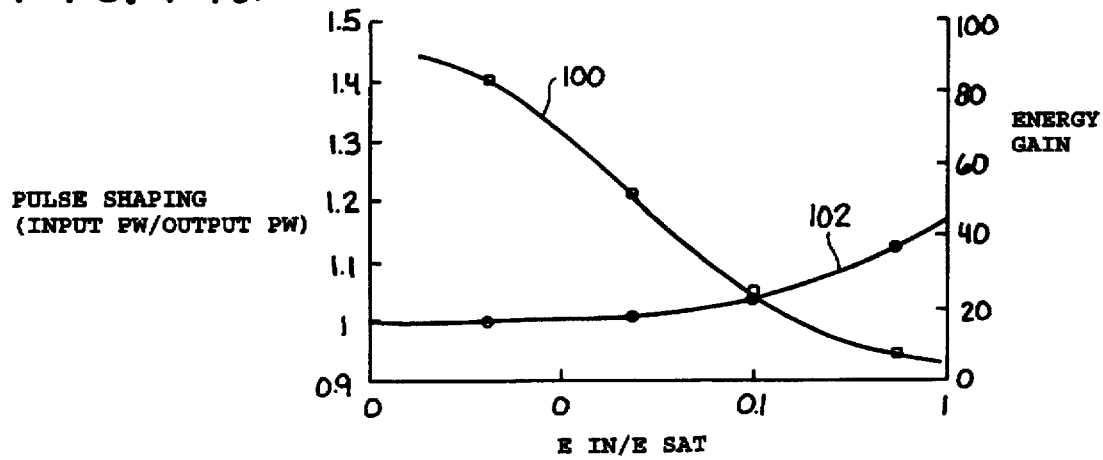
FIGS. 14a and b are graphs of the pulse shaping and energy gain of a flared amplifier as a function of the ratio of output energy and saturation energy for a uniform and flared amplifier respectively.
Figure 14B:
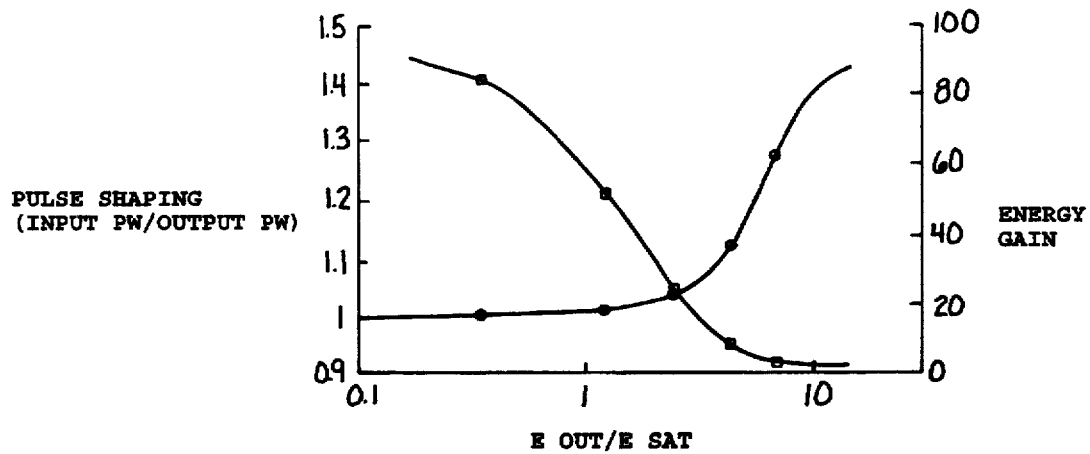

High mode-locked output power can be generated using a relatively simple diode laser configuration with these techniques. The pulsed operation of a flared amplifier is further illustrated in FIGS. 13a, 13b and FIGS. 14a, 14b. FIGS. 13a and 14a is a graph of both the ratio of input pulse width to output pulse width in energy gain as a function of the ratio of input energy to saturation energy of the laser device. FIGS. 13b and 14b are similar graphs but plotted as a function of the ratio of output energy to saturation energy. FIGS. 13a and 13b correspond to a flared gain section with a flare of 32 while FIGS. 14a and 14b correspond to a uniform width amplifier.

Comparison of FIGS. 13a and 14a show that the energy gain curve 100 is more than doubled when the input energy reaches the saturation energy from 5 to about 13 and is generally increased by the same ratio until the input energies become quite small, where the advantage of a flared gain section become less. Similarly, the ratio of the input pulse width to output pulse width is a function of the input to saturation energy ratio as shown by curve 102 in FIGS. 13a and 14a show substantially less pulse narrowing as compared to the uniform width amplifier as the saturation energy is approached.

Comparison of FIGS. 13b and 14b showing energy gain and pulse shaping as function of the ratio of the output energy to saturation energy are even more dramatically different between the flared amplifier and the uniform amplifier of FIG. 14b. Useful energy gains are retained for the flared amplifier even when the energy gain exceeds 10, whereas the energy gain begins to become severely degraded when the output energy exceeds the saturation energy by the factor of 5. Similarly, pulse shaping distortions do not exceed 10 percent with output energies 10 times higher than saturation energy in the flared amplifier where such pulse shaping degradation occur when the output energy is approximately 3 times higher than the saturation energy in the case of a uniform amplifier.

Figure 15A:
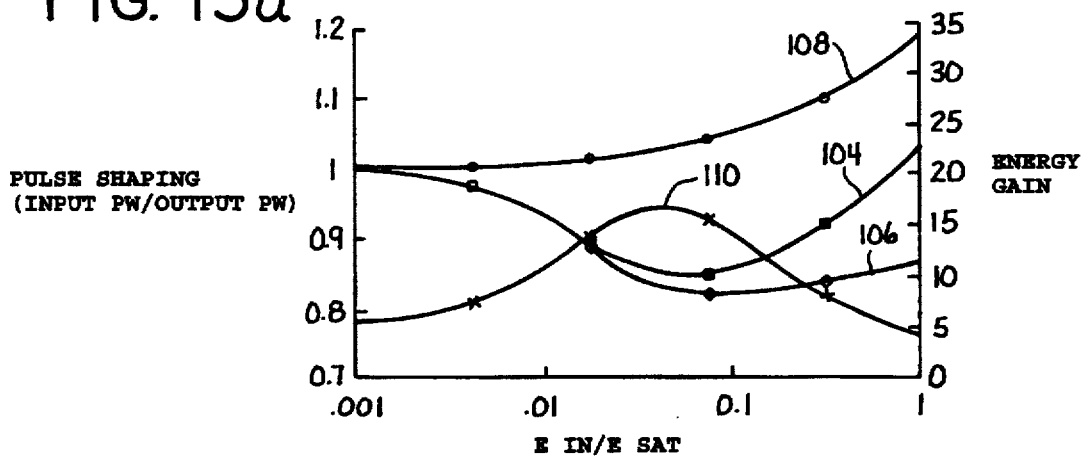
FIGS. 15a and b are graphs of the pulse shaping and energy gain of a single pass gain/absorber amplifier as a function of the ratio of input energy and saturation energy for a uniform and flared amplifier respectively.
Figure 15B:
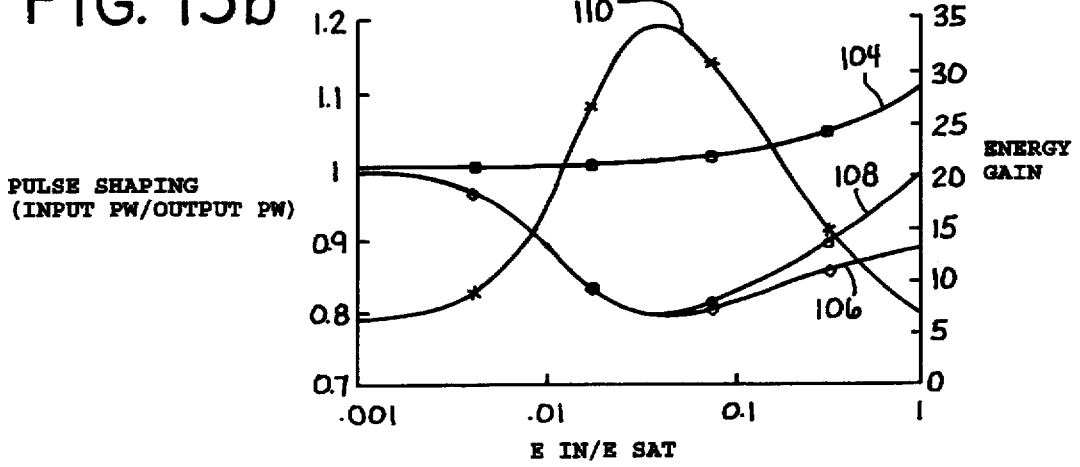

The pulse shaping and energy gain of a single pass gain/absorber cascade using a waveguide between the gain section and modulator section is shown in FIG. 15a for a uniform waveguide, and for a flared waveguide with a flare ratio of 3 in FIG. 15b plotted as function the ratio of input energy to saturation energy. In FIGS. 15a and b curve 104 represents the gain pulse shaping, while curve 106 represents the absorber pulse shaping. The net effect of these two curves is represented by the net pulse shaping curve 108. In a uniform single pass gain/absorber cascade amplifier, pulse shaping begins to degrade even at the very lowest energies and exceeds 10 percent at input energies approximately 30 percent of the saturation energy and above. By contrast, a flared gain absorber cascade as shown in FIG. 15b does not suffer pulse narrowing at any point in the range including up to input energies equal to the saturation energy.

The energy gain of a uniform single pass gain/absorber cascade amplifier is shown by curve 110 and reaches a peak of approximately 15 when the input energy is approximately 4 percent of the saturation energy. In the case of a flared gain absorber cascade, energy gains of approximately 35 are realized at the same point, as shown in FIG. 15b.

Figure 16A:
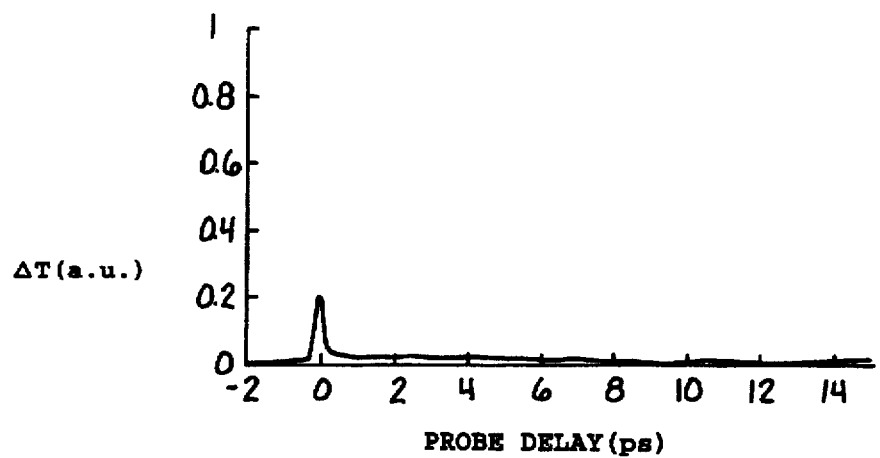
FIGS. 16a, b, and c are graphs of the temporal dependence of an optical pulse, and absorption and transmission coefficient of a slow saturable absorber.
Figure 16B:
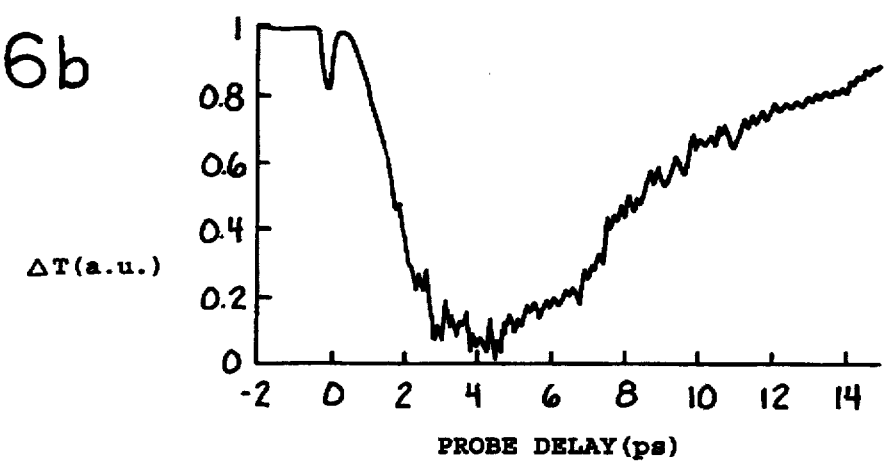
Figure 16C:
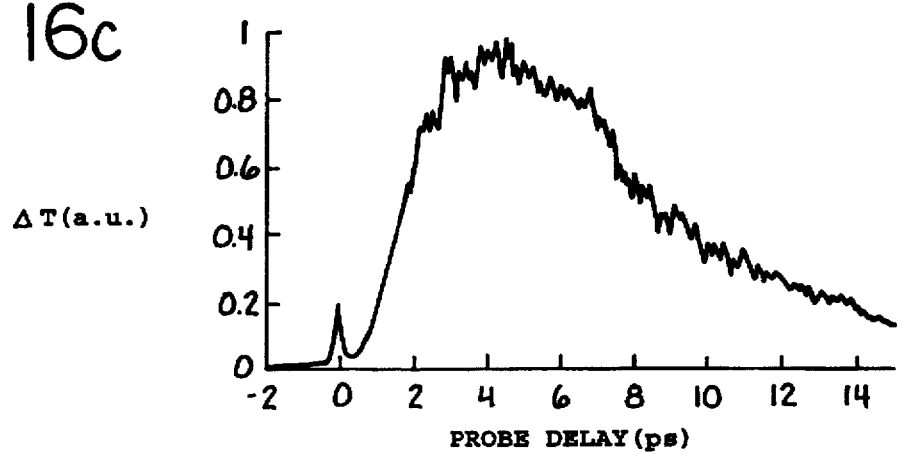

The absorption and transmission coefficients in a saturable absorber are time-dependent. However, the shape of what was thought to be a slow saturable absorber is not in fact what was previously believed, namely substantially constant with an exponential decrease after saturation has been achieved, but appears as depicted in FIGS. 16a–c, where FIG. 16a represents saturating optical pulse as a function of time, FIG. 16b the absorption coefficient and FIG. 16c the transmission coefficient as a function of time. Because the carrier temperature is rapidly increasing and the carrier density at the energy of the electron excitation is consequently reduced, the semiconductor saturable absorber can absorb more photons than is predicted based upon a first principles calculation. After several optical emission times, the carrier distribution cools to allow the semiconductor absorber to exhibit the expected gain at the original absorbing wavelength. In other words, the semiconductor saturable absorber has been bleached not to transparency as was conventionally thought, but past transparency to a condition where the material has gain. The time in which the material is gain positive is short and is limited by the time that it takes the carriers to be emitted from the heterostructure.

Therefore, what is contemplated by the invention is that large voltages are applied to a saturable absorber in a laser device to rapid heat the distribution to allow additional absorption. The large applied voltages will cause carriers to be emitted from the double heterostructure to turn the gain off very quickly. Further, the saturable absorber is designed so that carrier heating caused by travel through depletion region in a bulk absorber is maximized.

Figure 17:
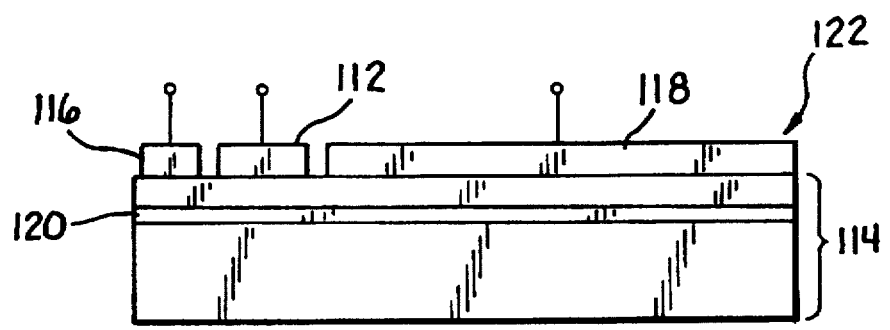
FIG. 17 is an in-plane laser utilizing the temporal dependence of FIGS. 16a, b, and c to provide lasing.

The gain in a saturable absorber occurs several picoseconds after the pulse has traveled through the semiconductor absorber region. The delay from the absorption of the pulse to the peak of the gain is approximately 2 picoseconds. The optical pulse in the meantime has traveled about 200 microns. FIG. 17 represents a first embodiment for an in-plane laser wherein a reverse biased saturable absorber 112 is disposed upon a heterostructure substrate 114 between DC gain sections 116 and 118. Saturable absorber 112 is disposed about 100 microns from input facet 120 of laser device 122. The pulse travels through bleaching saturable absorber 112 and then is returned 2 picoseconds later to experience gain and gain shaping of the pulse arising from the time-dependent absorption as depicted in FIG. 16b.

Figure 18:
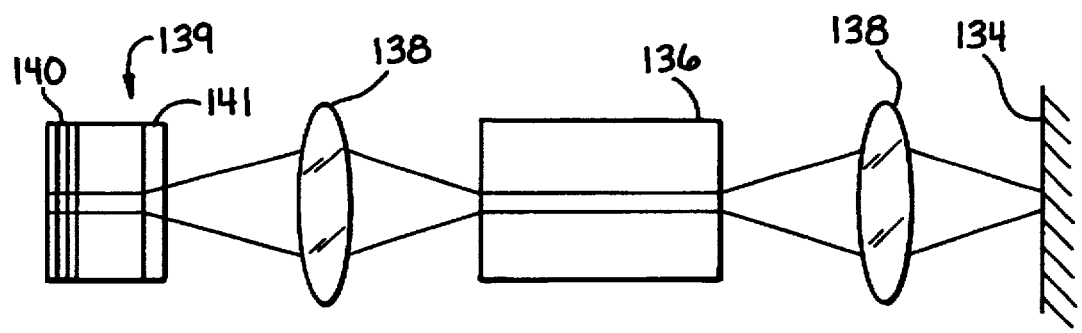
FIG. 18 is a laser assembly utilizing the temporal dependence of FIGS. 16a,b, and c in combination with a solid state gain element.

A second embodiment is illustrated diagrammatically in FIG. 18 wherein an offset absorber structure, generally denoted by reference numeral 139, has a mirror 140, such as a Bragg diffraction reflector grown on an opposite face of the heterostructure 128 opposite saturable absorber 141. Device 139 is then combined in a solid-state laser such as Ti:Sapphire or Nd:YAG laser such as depicted in FIG. 18 utilizing an exterior cavity mirror 134 with a Ti:Sapphire lasing segment 136 and lenses 138.

Many alterations and modifications may be made by those having ordinary skill in the art without departing from the spirit and scope of the invention. Therefore, it must be understood that the illustrated embodiment has been set forth only for the purposes of example and that it should not be taken as limiting the invention as defined by the following claims.

The following provides a partial description of what is regarded as a present equivalent to elements specifically described in the specification above. Throughout the specification, it must be understood that the mode-locked lasers which are described could be actively, passively or hybrid mode-lock or colliding pulse modelocked. Similarly, the amplifiers combined with such mode-locked lasers may either be tapered or straight. It is only necessary that the mode-locked laser have a narrow cross sectional region to maintain its operation within a single lateral mode. Since the saturation energy is proportional to the cross sectional area, the wide amplifier provides increased pulse power output.

The reflectors described in the specification may be devised by any means now known or later conceived. For example, the reflectors may be cleaved, coated with metal or dielectric stacks, or be distributed Bragg reflectors.

In addition, the material of the semiconductor lasers may be any semiconductor material which has optical gain such as alloys of indium gallium arsenide phosphide, indium gallium arsenide, gallium aluminum arsenide, gallium indium arsenide, gallium indium nitride, zinc sulphur selenide, indium gallium arsenide antimonide and lead tin tellurium and zeolites.

The form or structure of the laser material itself within the heterostructure may be any form now known or later employed including bulk semiconductor, quantum well, quantum dot or quantum wire structures. In the case of quantum wells, the wells may be undoped or modulation doped, uniformly p-doped or n-doped, strained or lattice matched. The substrate itself may be semi-insulating and either p or n type. The number of electrodes utilized on the mode-locked laser may vary from the single electrode to a large number, either operated at constant voltage in CW operation or pulsed or modulated in some manner. Typically, three electrodes are used, one for modulated gain section, saturable absorber section and the CW gain region or passive waveguide region. Other known sections could be employed as well in addition to these types.

The saturable absorber used in mode-locked laser such as described in connection with FIGS. 16–18 may be used in combination with any type of semiconductor solid-state, gas laser, dye laser, fiber laser or other lasing systems. For example in the case of solid-state gain elements as shown in FIG. 18, Ti:Sapphire, Nd:YAG, or Nd:YLF, or Alexandrite may be equivalently substituted for each other and other solid-state gain elements.

The words used in this specification to describe the invention and its various embodiments are to be understood not only in the sense of their commonly defined meanings, but to include by special definition structure, material or acts beyond the scope of the commonly defined meanings. The definitions of the words or elements of the following claims are, therefore, defined in this specification to include not only the combination of elements which are literally set forth, but all equivalent structure, material or acts for performing substantially the same function in substantially the same way to obtain substantially the same result.

In addition to the equivalents of the claimed elements, obvious substitutions now or later known to one with ordinary skill in the art are defined to be within the scope of the defined elements.

The claims are thus to be understood to include what is specifically illustrated and described above, what is conceptionally equivalent, what can be obviously substituted and also what essentially incorporates the essential idea of the invention.

We claim:

1. A pulsed laser assembly comprising:

a mode-locked semiconductor laser; and a tapered semiconductor optical amplifier having an input optically coupled to an output of said mode-locked semiconductor laser, wherein said mode-locked laser is a two-segment laser with a gain section and an absorber section, said gain section being flared, and wherein said flared gain section is flared toward said absorber section, whereby increased power output is realized.

2. A laser comprising:

a modulated gain region;

an absorber region; and a CW gain flared region disposed between said modulated gain region and absorber region, said modulated region and absorber region having differently sized cross sections and said CW flared region transitioning between said different cross sections of said modulated region and absorber region, wherein said modulated region has a cross section less than said absorber region and said CW flared region tapers up to said larger cross section of said absorber region.

whereby a mode-locked laser with increased pulse power output is realized.

3. A laser comprising:

a modulated gain region;

an absorber region; and a CW gain flared region disposed between said modulated gain region and absorber region, said modulated region and absorber region having differently sized cross sections and said CW flared region transitioning between said different cross sections of said modulated region and absorber region, wherein said CW flared region is flared both toward said modulated gain region and said absorber region and has a minimum cross section between said modulated gain region and absorber region and has matching cross sections adjacent to said modulated gain region and absorber region, whereby a mode-locked laser with increased pulse power output is realized.

4. A laser comprising:

a first reflector;

a saturable absorber region coupled to said first reflector and having an output;

a tapered gain region having an input coupled to said output of said saturable absorber region;

a modulated gain region having an input coupled to an output of said tapered gain region;

a flared CW gain region having an input coupled to an output of said modulated gain region; and a second reflector disposed at an output of said CW flared gain region so that the mode-locked laser is provided with higher pulsed output.

5. The laser of claim 4 wherein said tapered gain region is a CW gain region.

6. The laser of claim 4 wherein said tapered gain region is a passive gain region.

7. A pulsed laser assembly comprising:

a mode-locked semiconductor laser;

a tapered semiconductor optical amplifier having an input optically coupled to an output of said mode-locked semiconductor laser, said mode-locked laser having two segments comprising a gain section and an absorber section; and means for modulating said tapered optical amplifier synchronously with said mode-locked laser, whereby increased power output is realized.

8. A pulsed laser assembly comprising:

a mode-locked semiconductor laser; and a tapered semiconductor optical amplifier having an input optically coupled to an output of said mode-locked semiconductor laser, wherein said tapered optical amplifier is a CW gain amplifier and further comprises at least one additional cascaded amplifier stage coupled to an output of said tapered optical amplifier, said stage comprised of a modulated gain section having an output coupled to a CW gain flared section, whereby increased power output is realized.

9. The laser assembly of claim 8 wherein a plurality of said stages are serially cascaded together.

10. A laser comprising:

a first reflector;

a saturable absorber region coupled to said first reflector and having an output;

a CW tapered gain region having an input coupled to said output of said saturable absorber region;

a modulated gain region having an input coupled to an output of said tapered gain region;

a flared CW gain region having an input coupled to a output of said modulated gain region; and a second reflector disposed at an output of said modulated gain region so that the mode-locked laser is provided with higher pulsed output.

* * * * *